US007972687B2

(12) United States Patent
Lim et al.

(10) Patent No.: US 7,972,687 B2
(45) Date of Patent: Jul. 5, 2011

(54) POROUS SILICON AND METHOD OF PREPARING THE SAME

(75) Inventors: Sang Woo Lim, Seoul (KR); Young Hwan Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 475 days.

(21) Appl. No.: 11/967,138

(22) Filed: Dec. 29, 2007

(65) Prior Publication Data

US 2008/0166538 A1 Jul. 10, 2008

(30) Foreign Application Priority Data

Jan. 8, 2007 (KR) .................. 10-2007-0002121

(51) Int. Cl.
*B32B 3/26* (2006.01)
(52) U.S. Cl. .................. 428/312.6; 428/309.9; 428/212; 428/446

(58) Field of Classification Search .................. None
See application file for complete search history.

(56) References Cited

U.S. PATENT DOCUMENTS

2004/0146705 A1* 7/2004 Den et al. .................. 428/312.2
2006/0234391 A1* 10/2006 Weiss et al. .................. 436/518

FOREIGN PATENT DOCUMENTS

KR  1998-032008       7/1998
WO  WO 95/16280 A1   6/1995

* cited by examiner

*Primary Examiner* — Ling Xu

(57) ABSTRACT

The present invention relates to a porous silicon material comprising one or more pore parts which include a first pore, a second pore, and a third pore. The first pore is formed in an upper side of the silicon. The second pore is formed in a lower side of the first pore and has a diameter that is larger or smaller than a diameter of the first pore. The third pore is formed in a lower side of the second pore and has a diameter that is identical or similar to the diameter of the first pore. The pore part having a double structure is formed in a silicon material. Since different electronic materials can be implanted into different pores of the porous silicon, it is easy to form interfaces of the implanted electronic materials.

11 Claims, 6 Drawing Sheets

[Fig. 1]
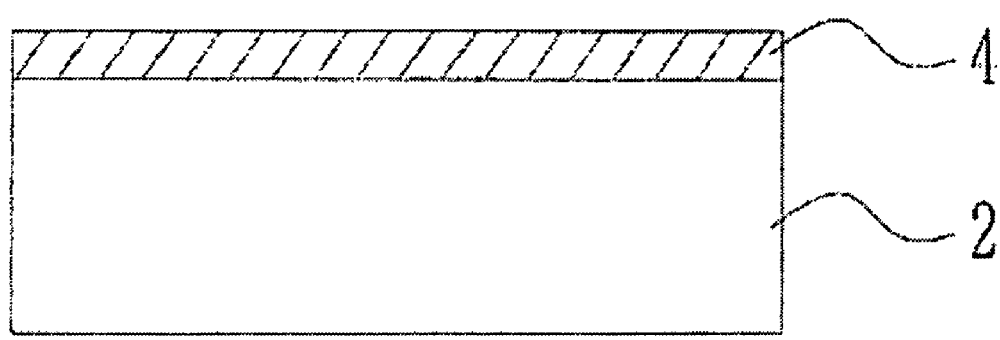
[Fig. 2]
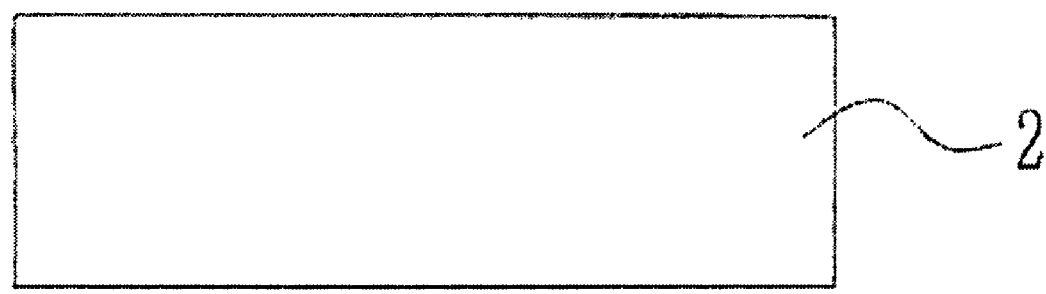

[Fig. 3A]
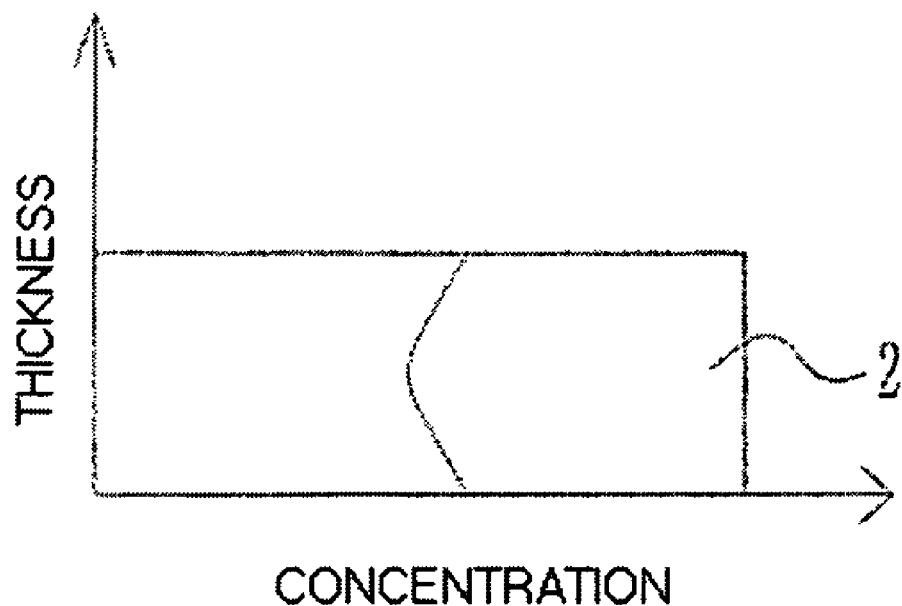
[Fig. 3B]
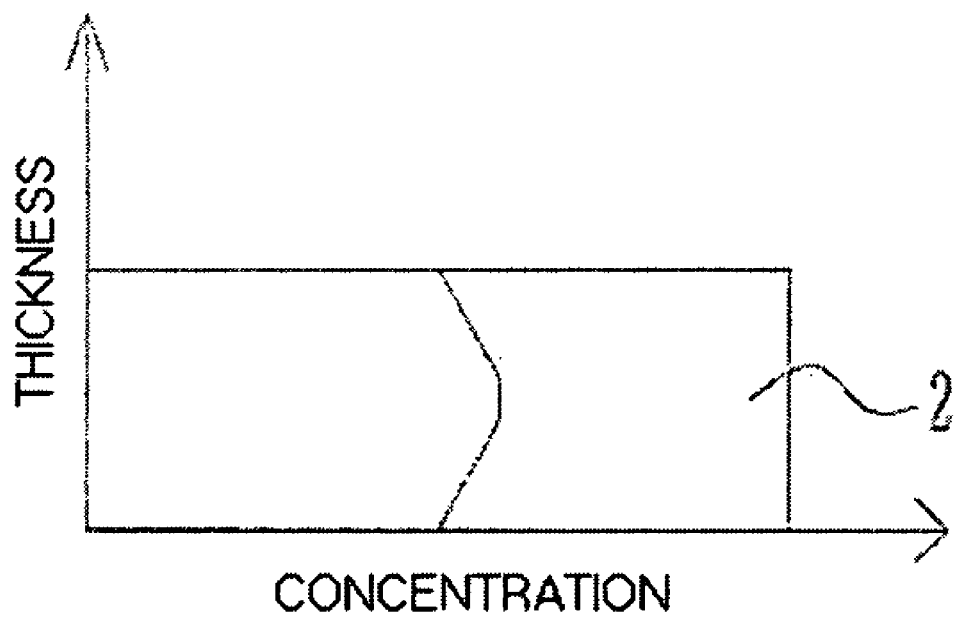

[Fig. 4A]
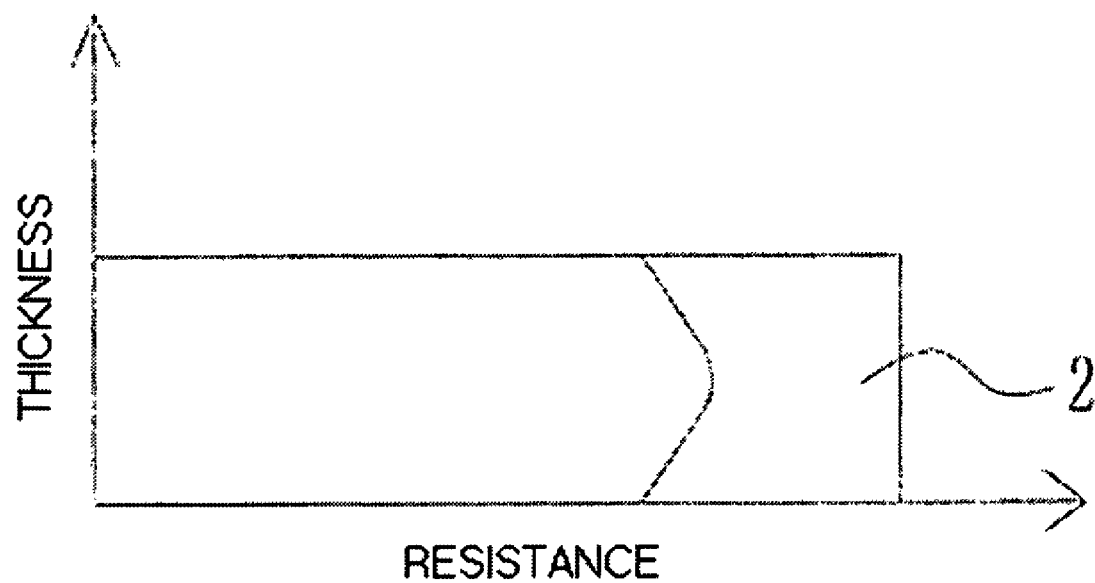
[Fig. 4B]
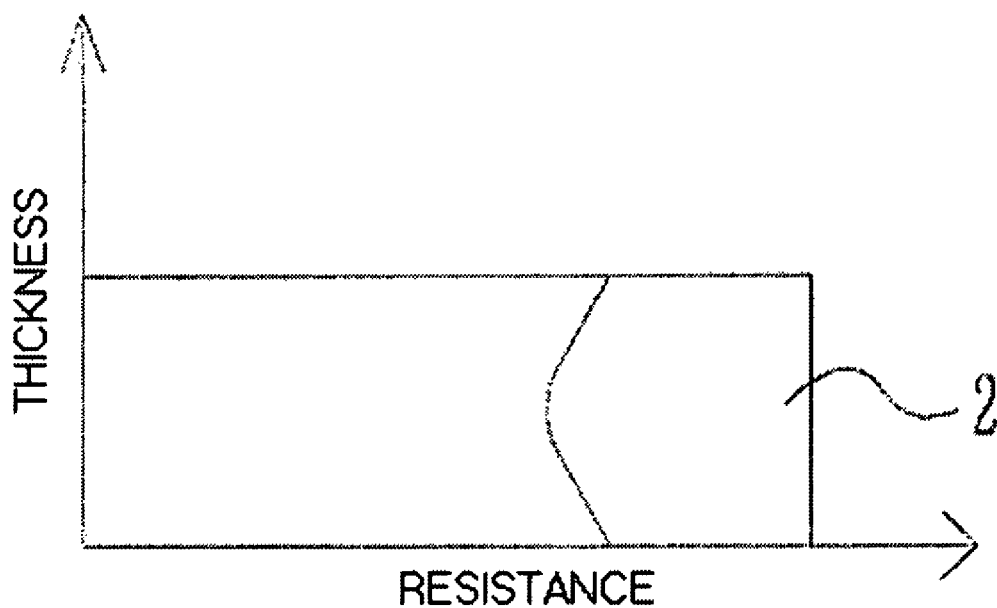

[Fig. 5A]
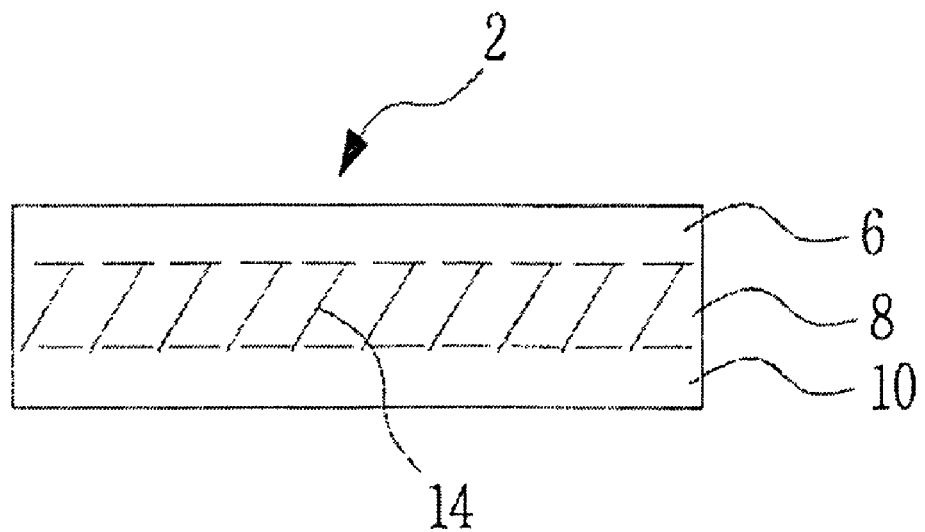
[Fig. 5B]
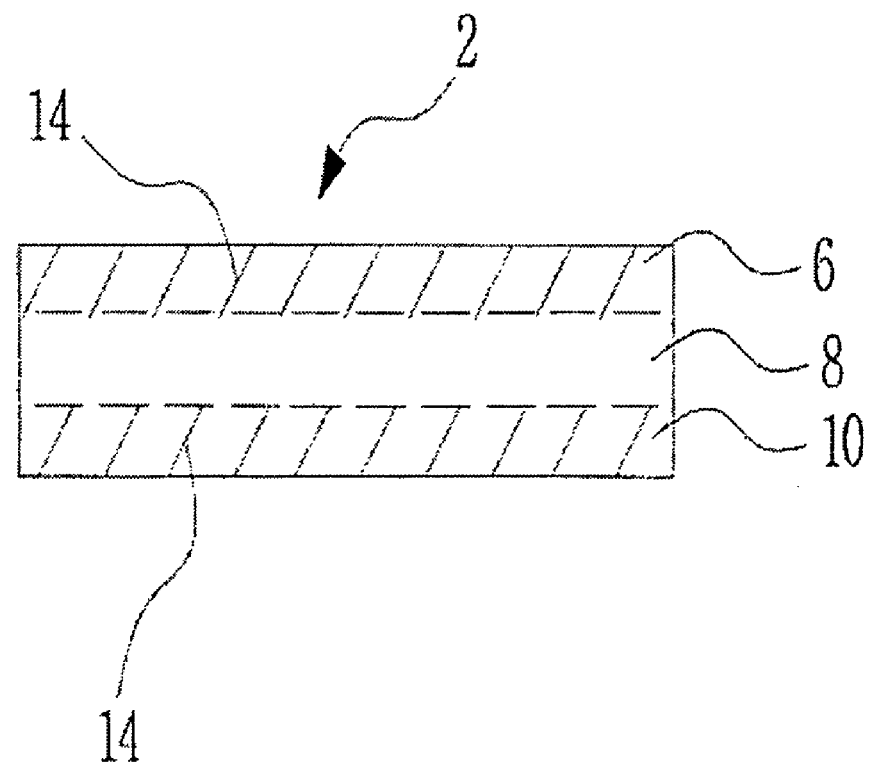

[Fig. 6A]
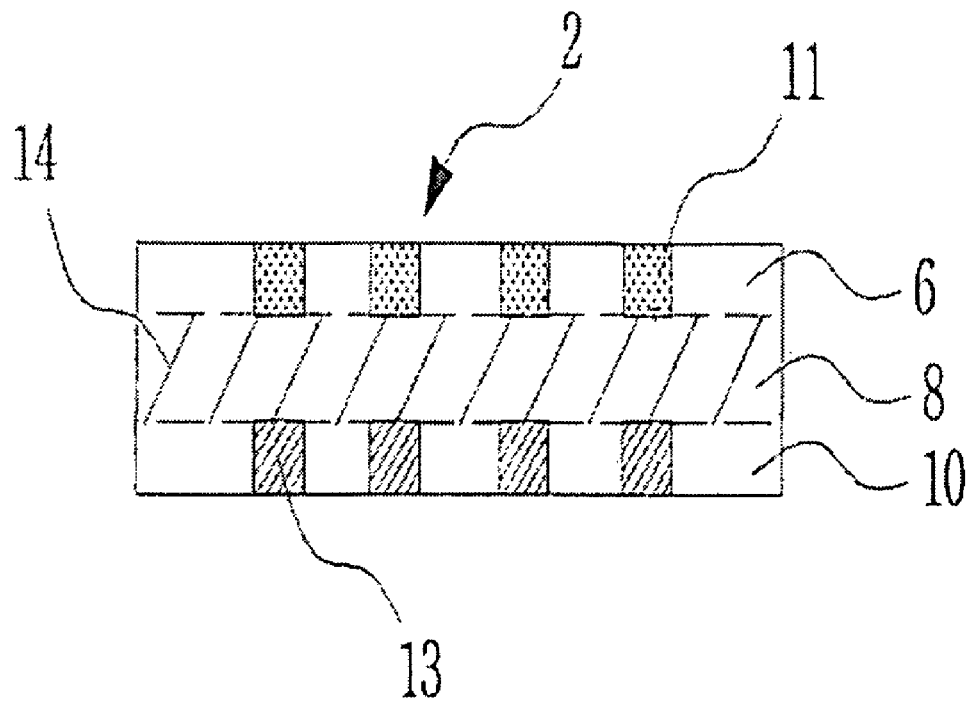
[Fig. 6B]
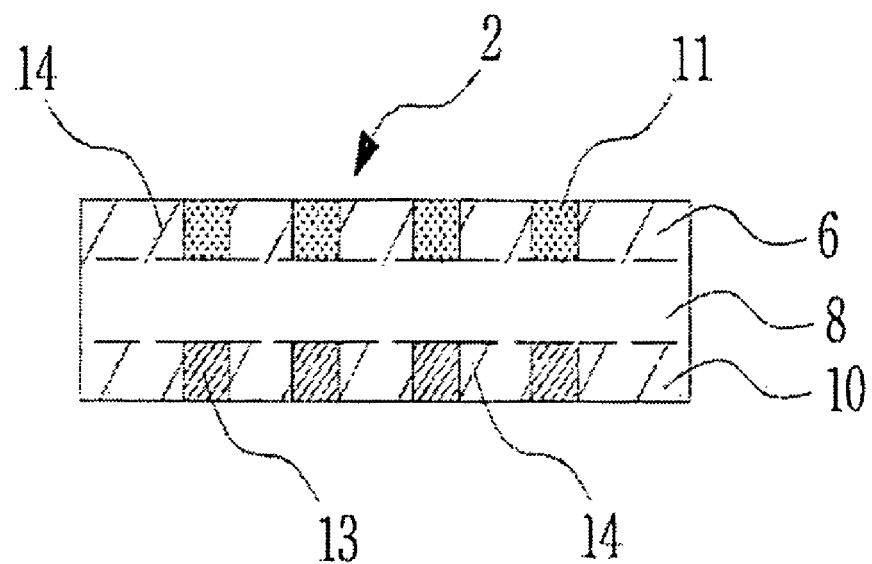

[Fig. 7A]
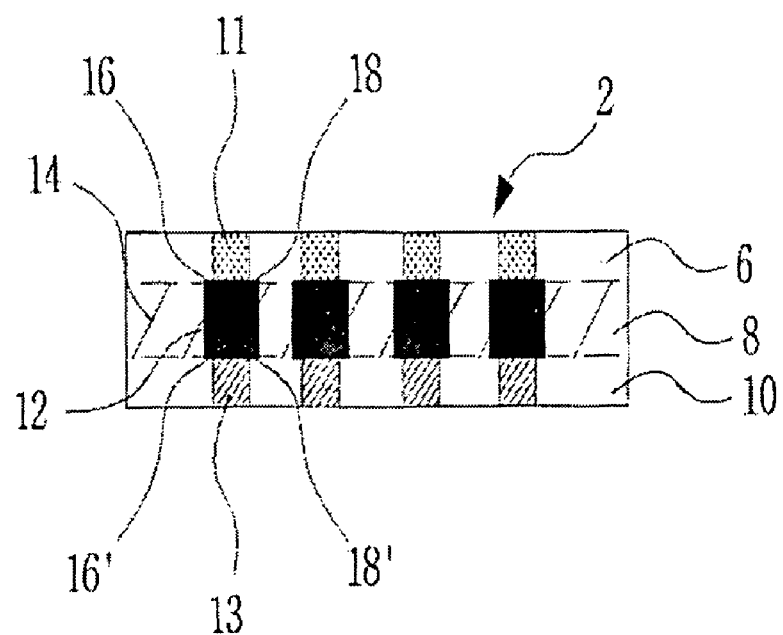
[Fig. 7B]
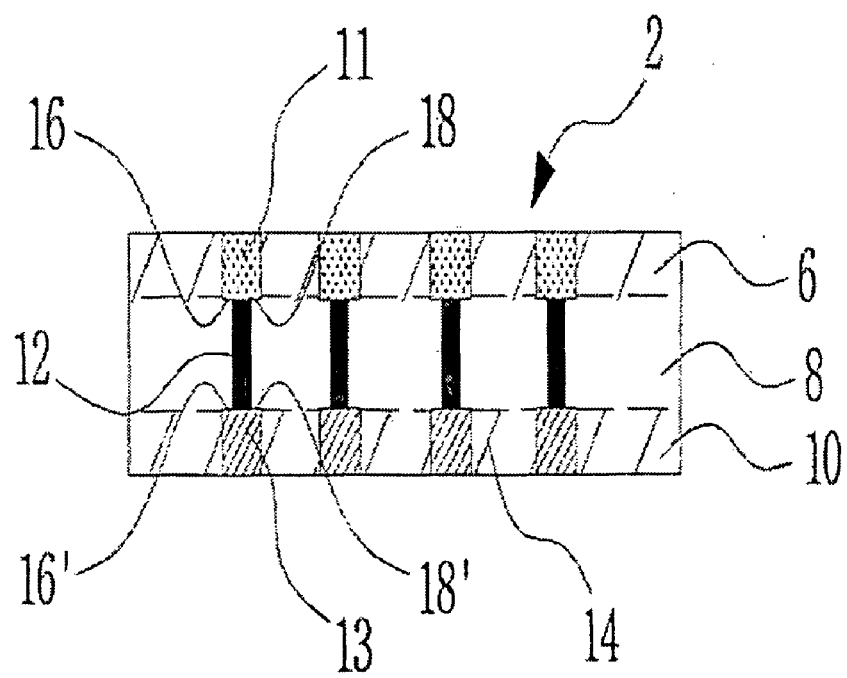

POROUS SILICON AND METHOD OF PREPARING THE SAME

BACKGROUND OF THE INVENTION

1. Field of the Invention

The present invention relates to a porous silicon having a step and a method of preparing the same and, more particularly, to a vertical-alignment type porous silicon and a method of preparing the same which includes performing diffusion or ion implantation in respects to a silicon and forming pores having steps by using anodizing.

2. Description of the Related Art

A porous silicon has a peculiar structure and an excellent volume ratio and surface area. For this reason, preparation of the porous silicon and development of novel technology using the same come into the spotlight.

Furthermore, in recent years, light emitting devices, diodes, high performance sensors, thin film electrodes, integrated circuits, and fuel cells have been developed and studied by using the porous silicon in several spaces. In views of studies of characteristics of the porous silicon, the above-mentioned studies relate to a method of using physical properties of the porous silicon, a method of using a surface area, and a method of using electric properties.

For example, Korean Patent No. 0392152 discloses a method of preparing a porous semiconductor material which is subjected to liquid dipping and crystalline at a part or at an entire part thereof. The method further includes drying the porous semiconductor material by using a supercritical drying process.

In addition, Korean Unexamined Patent Application Publication No. 10-1998-032008 discloses a porous silicon, a surface of which is coated with a polymer to be very stable in the atmosphere, and a method of preparing the same.

The porous silicon may be prepared by electrochemically anodizing a single crystal silicon while the single crystal silicon is dipped in a hydrofluoric acid (HF) solution. Accordingly, the main factor in the preparation of the porous silicon is electric resistance and a current density of the silicon. However, in practice, various variables other than the electric resistance and the current density affect a pore size and structure of the porous silicon. With respect to this, the mechanism regarding affection of the variables on formation of pores is not known.

Therefore, the size of the pore which is formed during the preparation of the porous silicon is experimentally obtained for the most case. Accordingly, there are problems in that the porous silicon which is formed by using a known method has frequently an undesired pore shape and an alignment state is poor.

Additionally, there is a problem in that unnecessary processes such as epitaxial growth or a sealing process are added during the preparation and application of the porous silicon.

The unnecessary processes cause a waste of resources and energy, and enable unnecessary layers to be formed in addition to the desired porous layer.

SUMMARY OF THE INVENTION

The present invention has been made keeping in mind the above disadvantages occurring in the related arts, an object of the present invention is to provide a vertical-alignment type porous silicon and a method of preparing the same which includes implanting an impurity on a silicon, dipping the silicon in an electrolyte solution, and performing anodizing to change electric resistance of the silicon, so that a diameter of each of pores is controlled or pores having different diameters depending on a thickness direction of the silicon are aligned.

BRIEF DESCRIPTION OF THE DRAWINGS

FIG. 1 is a sectional view of a known single crystal silicon on which an oxide film is formed;

FIG. 2 is a sectional view of a single crystal silicon from which an oxide film is removed according to the present invention;

FIG. 3A is a sectional view of an impurity concentration gradient of the single crystal silicon according to the present invention after diffusion;

FIG. 3B is a sectional view of an impurity concentration gradient of the single crystal silicon according to the present invention after ion implantation;

FIG. 4A is a sectional view of an electric resistance gradient of the single crystal silicon according to the present invention after diffusion;

FIG. 4B is a sectional view of an electric resistance gradient of the single crystal silicon according to the present invention after ion implantation;

FIG. 5A is a sectional view of an electric resistance layer of the single crystal silicon according to the present invention, which depends on a thickness, after diffusion;

FIG. 5B is a sectional view of an electric resistance layer of the single crystal silicon according to the present invention, which depends on a thickness, after ion implantation;

FIG. 6A is a sectional view illustrating formation of pores in a surface part of silicon according to the present invention after diffusion due to anodizing;

FIG. 6B is a sectional view illustrating formation of pores in the surface part of silicon according to the present invention after ion implantation due to anodizing;

FIG. 7A is a sectional view illustrating formation of pores in a middle part of silicon according to the present invention after diffusion due to anodizing; and FIG. 7B is a sectional view illustrating formation of pores in the middle part of silicon according to the present invention after ion implantation due to anodizing.

DESCRIPTION OF THE PREFERRED EMBODIMENTS

An aspect of the present invention provides a vertical-alignment type porous silicon including a first pore which is formed in an upper side of the silicon, a second pore which is formed in a lower side of the first pore and has a diameter that is larger or smaller than a diameter of the first pore, a third pore which is formed in a lower side of the second pore and has a diameter that is identical or similar to the diameter of the first pore, and one or more pore parts which includes the first pore, the second pore, and the third pore. As will be understood by those skilled in the art, the pores may have various shapes. The pores may have irregular-shaped openings and thus may not have perfectly circular openings. Accordingly, as used herein, the term "diameter" refers to an average width of the opening of a pore.

Another aspect of the present invention provides a method of preparing a vertical-alignment type porous silicon. The method includes (i) implanting an impurity on a silicon, (ii) anodizing the silicon into which the impurity is implanted by using an electrolyte solution to form pores in the silicon, and (iii) drying the silicon in which the pores are formed.

The first pore according to the present invention is formed in the upper part of the silicon. The first pore is formed through the upper side of the silicon, and may have any shape. It is preferable that the first pore have a hexagonal prism shape or a cylinder shape.

The second pore according to the present invention is formed in the middle part of the silicon. The second pore is formed through the lower side of the first pore and has a diameter that is larger or smaller than that of the first pore. The second pore may have any shape. It is preferable that the second pore have a hexagonal prism shape or a cylinder shape.

The third pore according to the present invention is formed in the lower part of the silicon. The third pore is formed through the lower side of the second pore and has a diameter that is identical or similar to that of the first pore. The third pore may have any shape. It is preferable that the third pore have a hexagonal prism shape or a cylinder shape.

The pore part which includes the first, the second, and the third pores has a surface area that is larger than that of a known vertical-alignment type porous silicon. Since different electronic materials, for example, platinum or Nafion, which are implanted into the pore part can be implanted into the different pores, it is easy to form interfaces of the implanted electronic materials.

A resistance gradient is formed in the silicon according to the type of impurity which is implanted into the silicon, and the diameter of the pore is controlled in respects to the thickness direction of the silicon according to the resistance gradient. Accordingly, the large pores are formed at an end of the silicon at which a high resistance layer is formed, and the small pores are formed at another end of the silicon at which a low resistance layer is formed.

The electrolyte solution according to the present invention functions to enable a current to easily flow through the silicon into which the impurity is implanted, so that the silicon is anodized. Any electrolyte solution may be used as long as the electrolyte solution has the above-mentioned function.

In connection with this, the electrolyte solution may contain fluorine or a hydrofluoric acid.

The solution which contains fluorine may be a solution containing ammonium fluoride, and the solution which contains the hydrofluoric acid may be a solution containing only the hydrofluoric acid or the hydrofluoric acid and dimethylformamide.

A method of preparing a vertical-alignment type porous silicon having the above-mentioned configuration according to the present invention includes (i) implanting an impurity on a silicon, (ii) anodizing the silicon into which the impurity is implanted by using an electrolyte solution to form pores in the silicon, and (iii) drying the silicon in which the pores are formed.

In step i according to the present invention, the impurity is implanted into the silicon. If the impurity is implanted into the silicon, a concentration gradient of the impurity is formed according to the thickness direction of the silicon. In connection with this, the implantation of the impurity may be performed by using ion implantation or diffusion.

The implantation of the impurity is performed at normal temperature by using the ion implantation, and at a temperature in the range of 900 to 1200° C. by using the diffusion.

In the case of when the impurity is implanted by using the diffusion, the concentration of the impurity is lowest at the middle part of the silicon and increases as moving toward the surface of the silicon, for example, the upper or lower part of the silicon. In the case of when the impurity is implanted by using the ion implantation, the concentration of the impurity is lowest at the surface of the silicon, for example, the upper or lower part of the silicon, and increases as moving toward the middle part of the silicon. Therefore, if the diffusion is used, the resistance gradient is formed so that the resistance is highest at the middle part of the silicon and decreases as moving toward the surface. If the ion implantation is used, the resistance gradient is formed so that the resistance is lowest at the middle part of the silicon and increases as moving toward the surface of the silicon.

In connection with this, any element of Group III and Group V of the periodic table of elements may be used as the ionized atom which is used to perform the ion implantation. However, it is preferable to use a boron (B) atom.

In respects to the impurity which is used when the impurity is implanted by using the diffusion, any impurity may be used as long as the impurity can form a resistance gradient on the silicon by using the diffusion. However, it is preferable to use boron or gas containing a Group III or Group V element including boron.

Due to the above-mentioned resistance gradient, the silicon includes about three different layers according to the thickness direction of the silicon. If the diffusion is performed, the high resistance layer is formed at the middle part of the silicon, and if the ion implantation is performed, the high resistance layer is formed at the surface part of the silicon. In connection with this, the electric resistance layer is confirmed by observing electric resistance while an apparent boundary layer is not observed.

Meanwhile, since a typical single crystal silicon which is used as the silicon has a surface on which an oxide film is formed, a silicon etching step may be performed to remove the oxide film from the surface of the silicon before step i where the impurity is implanted into the silicon is performed.

The electric resistance of the silicon from which the oxide film is removed during the etching step depends on the type of silicon, and is constant through the silicon as long as an additional special process is not performed.

In step ii according to the present invention, the silicon into which the impurity is implanted during step i is anodized by using the electrolyte solution to form the pores in the silicon. A current is applied to the electrolyte solution to anodize the silicon. As a result, the pores are formed. In connection with this, the current density may be in the range of 0.1 to 50 mA/cm2.

In connection with this, the electrolyte solution may be a solution containing fluorine or a hydrofluoric acid.

The solution which contains the hydrofluoric acid may be a solution containing only the hydrofluoric acid or 10 to 90% by weight of the hydrofluoric acid and 10 to 90% by weight of dimethylformamide (DMF). It is preferable to use a solution which contains 20% by weight of the hydrofluoric acid and 80% by weight of dimethylformamide. The solution containing the hydrofluoric acid may further contain acetonitrile if necessary.

Since the silicon has different resistance values according to the upper part, the middle part, and the lower part thereof, the diameter of the pore which is formed by using the anodizing may depend on the upper part, the middle part, and the lower part of the silicon.

However, since the electric resistance values of the upper part and the lower part of the silicon are identical or similar to each other, the diameters of the pores which are formed in the upper part and the lower part of the silicon are identical or similar to each other.

In step iii according to the present invention, the silicon in which the pores are formed during step ii where the silicon is anodized is dried. The silicon is dried at a temperature in the range of 0 to 50° C. for 30 to 60 min.

A washing step of washing the silicon by using water or alcohol may be further performed between the step for anodizing the silicon and the step for drying the silicon in order to remove the residual solvent from the silicon, if necessary.

In the vertical-alignment type porous silicon which is produced by using the above-mentioned method, since the pores having the different diameters are formed in the silicon to form the pore part having a double structure, the silicon may have an improved surface area as compared to a known porous silicon and it is easy to form boundary layers of contact materials.

Additionally, since stereoscopic electric properties are ensured, the silicon can have a function required in improved electronic devices. Due to a surface difference and a difference in porosity which are caused by a difference in diameter of the pores according to the thickness direction, the silicon can be usefully applied to fuel cells and improve a sensing ability of a sensor.

Furthermore, in the case of when the silicon is applied to a mold for manufacturing nanowires, it is possible to manufacture nanowires having a double structure. If the pore of the porous silicon has a double structure, since optical properties depend on the thickness, displaying abilities of light emitting devices and light emitting diodes can be improved.

The vertical-alignment type porous silicon according to the present invention may be used in light emitting devices, diodes, high-performance sensors, thin film electrodes, integrated circuits, fuel cells and the like.

In the vertical-alignment type porous silicon according to an aspect of the present invention, platinum (Pt) is provided in the pores formed in the middle part of the silicon and Nafion is implanted in the upper part and the lower part of the silicon to manufacture a fuel cell, thus, the better effect is ensured as compared to a known silicon substrate or porous silicon.

According to the vertical-alignment type porous silicon of the present invention and a method of preparing the same, compounds of element of Group IV or aluminum may be used instead of silicon to produce a porous electronic material having pore parts if necessary.

Hereinafter, the present invention will be described in detail with reference to the accompanying drawings. However, the following description is set forth to illustrate, but are not to be construed to limit the present invention.

FIG. 2 is a sectional view of a single crystal silicon from which an oxide film is removed according to the present invention, FIG. 3A is a sectional view of an impurity concentration gradient of the single crystal silicon according to the present invention after diffusion, FIG. 3B is a sectional view of an impurity concentration gradient of the single crystal silicon according to the present invention after ion implantation, FIG. 4A is a sectional view of an electric resistance gradient of the single crystal silicon according to the present invention after diffusion, FIG. 4B is a sectional view of an electric resistance gradient of the single crystal silicon according to the present invention after ion implantation, FIG. 5A is a sectional view of an electric resistance layer of the single crystal silicon according to the present invention, which depends on a thickness, after diffusion, FIG. 5B is a sectional view of an electric resistance layer of the single crystal silicon according to the present invention, which depends on a thickness, after ion implantation, FIG. 6A is a sectional view illustrating formation of pores in a surface part of silicon according to the present invention after diffusion due to anodizing, FIG. 6B is a sectional view illustrating formation of pores in the surface part of silicon according to the present invention after ion implantation due to anodizing, FIG. 7A is a sectional view illustrating formation of pores in a middle part of silicon according to the present invention after diffusion due to anodizing, and FIG. 7B is a sectional view illustrating formation of pores in the middle part of silicon according to the present invention after ion implantation due to anodizing.

As shown in FIGS. 2 to 7, the vertical-alignment type porous silicon according to the present invention includes a first pore 11 which is formed in an upper side of the silicon, a second pore 12 which is formed in a lower side of the first pore 11 and has a diameter that is larger or smaller than a diameter of the first pore 11, a third pore 13 which is formed in a lower side of the second pore 12 and has a diameter that is identical or similar to the diameter of the first pore 11, and one or more pore parts 11, 12, and 13 which includes the first pore 11, the second pore 12, and the third pore 13.

As shown in FIG. 1, the typical single crystal silicon 2 has the surface on which an oxide film 4 is formed. Since the oxide film 4 may obstruct anodizing of the silicon 2, as shown in FIG. 2, the oxide film 4 may be removed by using the etching process before the porous silicon 2 according to the present invention is prepared.

In respects to the silicon 2 according to the present invention, in the case of when the impurity is implanted by using the diffusion, as shown in FIG. 3A, the concentration gradient is formed so that the concentration of the impurity is lowest at the middle part 8 of the silicon and increases as moving toward the surface parts 6 and 10 of the silicon, for example, the upper part 6 and the lower part 10 of the silicon. In the case of when the impurity is implanted by using the ion implantation, as shown in FIG. 3B, the concentration gradient is formed so that the concentration of the impurity is highest at the middle part 8 of the silicon and decreases as moving toward the surface parts 6 and 10 of the silicon. In connection with this, a horizontal direction of FIGS. 3A and 3B means the concentration of the impurity and increases as moving toward the right. A vertical direction means the thickness of the silicon 2.

Therefore, in the case of the silicon 2 which is obtained by using the diffusion, as shown in FIG. 4A, the resistance gradient is formed so that the resistance is highest at the middle part 8 of the silicon and decreases as moving toward the surface parts 6 and 10 of the silicon. In the case of the silicon 2 which is obtained by using the ion implantation, as shown in FIG. 4B, the resistance gradient is formed so that the resistance is lowest at the middle part 8 of the silicon and increases as moving toward the surface parts 6 and 10 of the silicon.

The ion implantation means that ionized atoms are accelerated by using energy of tens to hundreds kV to be forcibly implanted into the silicon 2 so that the composition, the combination state, and the crystal structure of the material at the surface of the silicon 2 are changed to improve hardness, wear resistance, corrosion resistance, and fatigue resistance.

In addition, the diffusion means a process in which a material moves from a high concentration region to a low concentration region due to random movement of molecules. In the present invention, the silicon 2 is heated at about 1000° C. and exposed to gas, thus performing the diffusion.

In connection with this, the gas may contain any element of Group III or Group V of the periodic table of elements. Preferably, the gas containing boron is used.

Due to the above-mentioned resistance gradient, the silicon 2 has three different layers, for example, the upper part 6 of the silicon, the middle part 8 of the silicon, and the lower part 10 of the silicon, according to the thickness direction of the silicon. If the silicon 2 is obtained by using the diffusion, as shown in FIG. 5A, the high resistance layer 14 is formed at the middle part 8 of the silicon, and if the silicon 2 is obtained by using the ion implantation, as shown in FIG. 5B, the high resistance layer 14 is formed at the surface parts 6 and 10 of the silicon.

When the silicon 2 into which the impurity is implanted by using the diffusion is dipped in the solution which contains fluorine or a hydrofluoric acid, for example, the solution which contains 20% by weight of the hydrofluoric acid (HF) and 80% by weight of dimethylformamide (DMF), to perform the anodizing, as shown in FIGS. 6A and 7A, the first pore 11 and the third pore 13 are formed at the surface parts 6 and 10 of the silicon at which the electric resistance value is low, and the second pore 12 that is larger than the pores 11 and 13 formed in the surface parts 6 and 10 of the silicon is then formed at the middle part 8 of the silicon at which the electric resistance value is high.

In addition, when the silicon 2 into which the impurity is implanted by using the ion implantation is dipped in the solution which contains fluorine or the hydrofluoric acid to perform the anodizing, as shown in FIGS. 6B and 7B, the first pore 11 and the third pore 13 are formed at the surface parts 6 and 10 of the silicon at which the electric resistance value is high, and the second pore 12 that is smaller than the pores 11 and 13 formed in the surface parts 6 and 10 of the silicon is then formed at the middle part 8 of the silicon at which the electric resistance value is low.

Since the pores 11, 12, and 13 having different diameters are formed at the surface parts 6 and 10 and the middle part 8 of the silicon, step parts 16, 16', 18, and 18' are formed between the first pore 11 and the third pore 13, and the second pore 12. The step parts 16, 16', 18, and 18' include first step parts 16 and 16' which are vertically symmetrical in the same pore based on a transversal axis direction of the silicon, and second step parts 18 and 18' which are horizontally symmetrical in respects to the first step parts 16 and 16' in the same pore based on a longitudinal axis direction of the silicon.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

According to the present invention as described above, a pore part having a double structure is formed in a silicon. Thus, the silicon having an improved surface area can be obtained as compared to a known porous silicon, and since different electronic materials can be implanted into different pores, it is easy to form interfaces of the implanted electronic materials.

What is claimed is:

1. A vertical-alignment type porous silicon material, comprising:
    a plurality of pores aligned vertically within the silicon material,
    wherein the pores include a first pore, a second pore, and a third pore that extend from an upper surface of the silicon material to a lower surface of the silicon material,
    wherein a diameter of the first pore and a diameter of the third pore are substantially the same and a diameter of the second pore is larger or smaller than the diameter of the first pore,
    wherein the first pore is provided in a first region of the silicon material that has a first impurity concentration,
    wherein the second pore is provided in a second region of the silicon material that has a second impurity concentration,
    wherein the third pore is provided in a third region of the silicon material that has a third impurity concentration, and
    wherein the first impurity concentration and the second impurity concentration are different, and the third impurity concentration and the second impurity concentration are different.

2. The vertical-alignment type porous silicon material according to claim 1, wherein a step part is formed between the first pore and the third pore.

3. The vertical-alignment type porous silicon material according to claim 1, wherein the first impurity concentration and the third impurity concentration are substantially the same.

4. A vertical-alignment type porous silicon material, the silicon material comprising;
    a first layer of silicon having a first impurity concentration and a plurality of first pores, the first pores having a first opening size corresponding to the first impurity concentration;
    a second layer of silicon having a second impurity concentration and a plurality of second pores provided below the first layer, the second pores having a second opening size corresponding to the second impurity concentration; and
    a third layer of silicon having a third impurity concentration and a plurality of third pores provided below the second layer, the third pores having a third opening size corresponding to the third impurity concentration,
    wherein the first opening size and the second opening size are different in size.

5. The vertical-alignment type porous silicon according to claim 4, wherein the second opening size and the third opening size are different in size.

6. The vertical-alignment type porous silicon according to claim 5, wherein the first opening size and the third opening size are substantially the same in size.

7. The vertical-alignment type porous silicon according to claim 5, wherein the first opening size is an average opening size of the first pores, the second opening size is an average opening size of the second pores, and the third opening size is an average opening size of the third pores.

8. The vertical-alignment type porous silicon according to claim 4, wherein the second opening size is bigger than the first opening size.

9. The vertical-alignment type porous silicon according to claim 4, wherein the first layer, the second layer, and the third layer are defined in a unitary, single silicon material.

10. The vertical-alignment type porous silicon material according to claim 4, wherein the first impurity concentration and the second impurity concentration are different, and the third impurity concentration and the second impurity concentration are different.

11. The vertical-alignment type porous silicon material according to claim 4, wherein the first impurity concentration and the third impurity concentration are substantially the same.

* * * * *